United States Patent [19]

Schneller et al.

[11] Patent Number: 4,795,829
[45] Date of Patent: Jan. 3, 1989

[54] PROCESS FOR SEPARATING HIGHER MOLECULAR WEIGHT CONSTITUENTS FROM PHENOL POLYMERS

[75] Inventors: Arnold Schneller, Mainz-Finthen; Gabriele Lambert, Wiesbaden, both of Fed. Rep. of Germany

[73] Assignee: Hoechst Aktiengesellschaft, Frankfurt am Main, Fed. Rep. of Germany

[21] Appl. No.: 25,976

[22] Filed: Mar. 16, 1987

[30] Foreign Application Priority Data

Mar. 14, 1986 [DE] Fed. Rep. of Germany ....... 3608492

[51] Int. Cl.$^4$ .............................................. C07C 37/68
[52] U.S. Cl. ..................................... 568/750; 568/724; 568/749; 568/753
[58] Field of Search ............... 568/724, 749, 750, 726, 568/748, 753

[56] References Cited

U.S. PATENT DOCUMENTS

| | | | |
|---|---|---|---|
| 2,829,175 | 4/1958 | Bowman et al. | 568/724 |
| 2,862,976 | 12/1958 | Dubbs et al. | 568/724 |
| 2,959,622 | 11/1960 | Grimme | 568/724 |
| 4,348,471 | 9/1982 | Shelnut et al. | 430/165 |
| 4,507,509 | 3/1986 | Mandiratta et al. | 568/749 |
| 4,626,605 | 12/1986 | Wojtech et al. | 568/724 |

FOREIGN PATENT DOCUMENTS 0144880 6/1985 European Pat. Off. .

OTHER PUBLICATIONS

8"Handbook of Chemistry and Physics", pp. D-12-7-D-149; (1977).
Chemical Abstracts, vol. 68, No. 16, 78918d, Apr. 15, 1968.
Chemical Abstracts, vol. 98, No. 26, 98:225293w, Jun. 27, 1983.

Primary Examiner—Werren B. Lone
Attorney, Agent, or Firm—Foley & Lardner, Schwartz, Jeffery, Schwaab, Mack, Blumenthal & Evans

[57] ABSTRACT

A process for separating higher molecular weight constituents from phenol polymers, wherein the phenol polymer is dissolved in an organic solvent medium, the solution obtained is mixed at room temperature with ammonia or an amine such that there is a stoichiometric deficiency of ammonia or amine, the precipitate is separate, dried, if appropriate, and treated with aqueous acid, and the resulting sediment is filtered off, washed and dried as described. The starting phenol polymer preferably is a condensation product of optionally substituted phenol and formaldehyde. The process yields fractions possessing an increased osmometric molecular weight, a narrower molecular weight distribution range and an increased glass transition temperature.

21 Claims, 1 Drawing Sheet

PROCESS FOR SEPARATING HIGHER MOLECULAR WEIGHT CONSTITUENTS FROM PHENOL POLYMERS

BACKGROUND OF THE INVENTION

The present invention relates to a process for separating higher molecular weight constituents from phenol polymers, in particular to the separation of higher-molecular compounds from optionally substituted phenol/formaldehyde condensation products.

Phenol polymers are very important raw materials for the production of molded articles and molding compounds, protective lacquers for metals or insulating materials in combination with epoxy resins. In the more recent past, they have gained importance in new fields of application, for example, as fire-resistant fibers, as support materials for ion exchangers or as binders in copying materials, such as photoresists. For these new applications the polymers must, however, meet higher requirements. Commercially available phenol polymers contain varying amounts of low-molecular constituents, which for a number of uses bring about disadvantageous effects. Thus, the processing of phenol polymers at elevated temperatures causes serious environmental problems due to the high vapor pressure of the low molecular weight constituents, so that expensive exhaust appliances must be installed. Furthermore, the relatively high content of low molecular weight compounds is responsible for the low softening temperature of phenol polymers. This serious disadvantage associated with low softening temperatures in particular affects the application of phenol polymers at elevated temperatures, for example, in their use as photoresist binders. At temperatures above about 140° C. the photochemically produced structures start to flow, resulting in an undesireable, insufficient, and poor resolution.

European Patent Application No. 0 144 880 discloses a method for performing a fractionated precipitation of novolaks in order to separate off undesired, low molecular weight constituents. For this purpose, the novolaks are dissolved in a suitable solvent and reprecipitated by adding a precipitant. Thie process necessitates a careful selection of the appropriate solvents or precipitants and a strict observance of the correct temperature, in order to be able to achieve reproducible results.

German Offenlegungsschrift No. 32 22 485 (equivalent to U.S. Pat. No. 4,348,471) discloses acidfree resins. Novolaks are treated with bases, for example, tertiary amines, in order to remove, by neutralization, the acid added for the preparation of the novolaks. No fractionating of the novolaks is described.

SUMMARY OF THE INVENTION

It is therefore an object of the present invention to provide a process for separating higher molecular weight constituents from phenol polymers in order to obtain a material having good heat resistance, higher molecular weight and a narrow molecular weight distribution range.

It is therefore another object of the present invention to provide a process for separating higher molecular weight constituents from phenol polymers which can achieve reproducible results.

It is also an object of the present invention to provide a phenol polymer having a reduced amount of low molecular weight fractions.

It is a further object of the present invention to provide a phenol polymer useful as raw material for making improved molded articles, molding compounds, photoresists and the like.

Another object of the present invention is to provide a process for producing a phenol polymer having an increased osmometric molecular weight and increased glass transition temperature.

In accordance with one object of the present invention, these objects are achieved by a process for separating higher molecular weight constituents from a phenol polymer comprising the steps of:
 (a) dissolving the phenol polymer in an organic solvent medium so as to form a solution;
 (b) mixing the solution with ammonia or an amine in an amount sufficient to provide a stoichiometric deficiency of the ammonia or the amine, respectively, so as to form a precipitate;
 (c) separating the precipitate from the solution;
 (d) optionally, drying the precipitate;
 (e) treating the precipitate with an aqueous acid so as to form a sediment; and
 (f) separating the sediment from the aqueous acid.

These objects are further achieved, in accordance with another aspect of the present invention by provision of a phenol polymer produced by the process of the present invention, having fractions of the higher molecular weight constituents which possess a higher osmometric molecular weight and a higher glass transistion temperature than the starting phenol polymer.

There has also been provided according to the present invention a molding compound which comprises a high molecular weight novolak produced by the above process and at least one particulate filler material.

While the invention has been described in reference to various embodiments, it is understood that many modifications and improvements may be made by those skilled in the art without departing from the scope of the novel concepts and teachings of the present invention.

BRIEF DESCRIPTION OF THE DRAWINGS

An illustrative embodiment of the invention is described in further detail below and is represented graphically in the drawings, in which.

DETAILED DESCRIPTION OF PREFERRED EMBODIMENTS

The invention comprises a process, wherein the phenol polymer is dissolved in an organic solvent medium, the solution obtained is mixed, at room temperature, with ammonia or an amine, such that there is a stoichiometric deficiency of ammonia and amine, the precipitate is separated, dried, if appropriate, and treated with aqueous acid, and the resulting sediment is filtered off, washed and dried. The organic solvent medium used is an organic solvent or an organic solvent mixture. The solution is preferably mixed with from about 1 to about 40 mole percent of ammonia or amine. The precipitate is preferably taken up in an organic solvent medium, and then treated with an aqueous acid.

Figure 1:
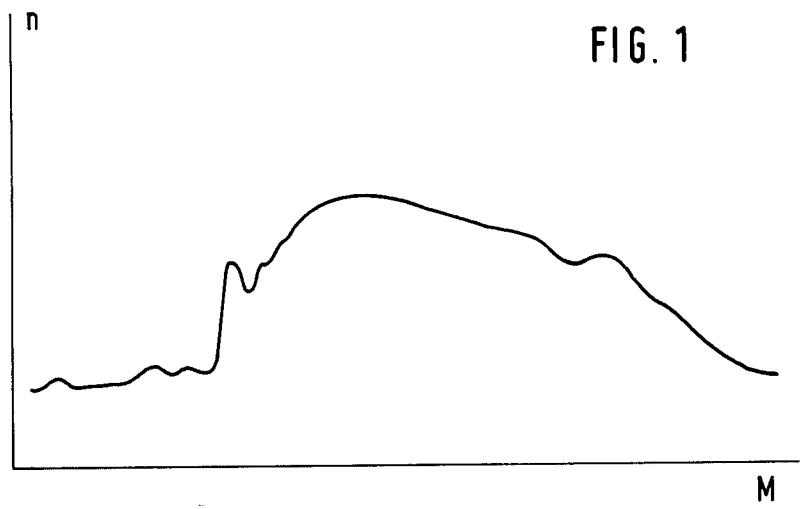
FIG. 1 is a graph of a comparative example that shows the molecular weight distribution of an untreated phenol polymer, with calculation index n, as an indication of the amount of the individual molecules, being shown as a function of the molecular weight.
Figure 2:
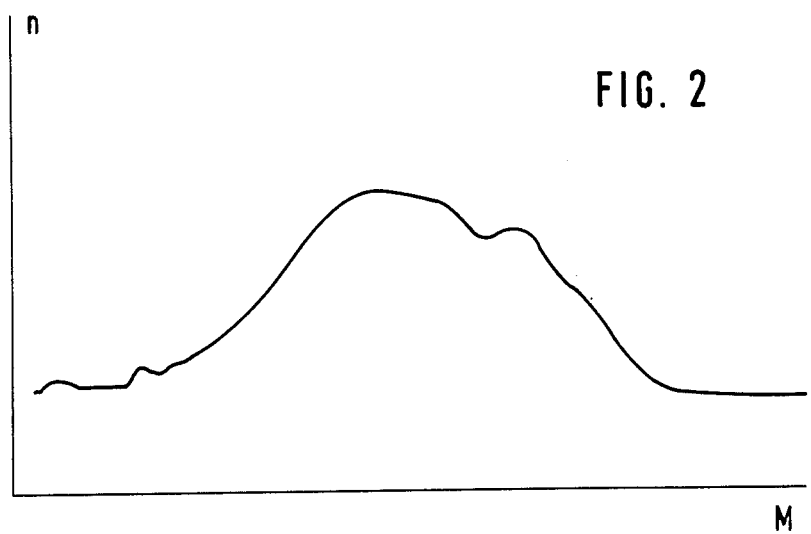
FIG. 2 is a graph that shows the molecular weight distribution of the phenol polymer shown in FIG. 1 which has been subjected to the process according to the present invention.

The invention is illustrated by the diagrams below which indicate the result obtained from gel permeation chromatography (GPC diagrams). FIG. 1 represents a GPC diagram of an untreated phenol polymer (recorded by means of a commercially available gel permeation chromatograph), with the calculation index (n), which is analogous to the quantity indicating the amount of the individual molecules being plotted against the molecular weight (M). FIG. 2 represents the GPC diagram of the same phenol polymer, which has, however, been subjected to the treatment according to this invention. It is clearly visible that the peaks in the low molecular weight range of FIG. 1 have disappeared from FIG. 2. The maximum of the curve shown in FIG. 2 is shifted towards the range of increased molecular weights as compared to the maximum of the curve shown in FIG. 1. At the same time, the range of molecular weight distribution of FIG. 2 is narrower than that of FIG. 1.

Within the scope of the present invention, the term "phenol polymer" denotes polymers having phenolic hydroxy groups. In particular, a condensation product of optionally substituted phenol and formaldehyde is employed, which corresponds to the general formula I

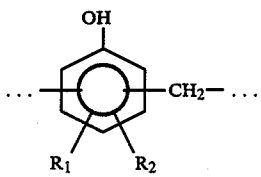

in which
  $R_1$ and $R_2$ are identical or different and denote hydrogen and/or branched or unbranched alkyl groups having from one to nine carbon atoms.
Preferably,
  $R_1$ denotes a hydrogen atom and
  $R_2$ denotes a branched or unbranced alkyl chain having from one to four carbon atoms, in particular a methyl group or tertiary butyl group.

Examples of preferably employed phenol polymers include novolaks of phenol, cresol or tertiary, butylphenol and formaldehyde. A survey of these compounds is given in "Chemistry and Application of Phenolic Resins," by A. Knop and W. Scheib, Springer Verlag 1979, which is herein incorporated by reference.

The phenol polymers which are suitable for the purposes of the present invention are constituted by recurring units of identical or different structural composition.

The process according to the present invention can generally be employed for the separation of high molecular weight constituents from polymers possessing phenolic hydroxy groups.

The molecular weight of the phenol polymers which can be used as starting materials for the process of the present invention is not restricted by an upper limit. The lower limit is determined by the structure of the respective polymer and by the polymer content of low molecular weight compounds. Preference is given to polymers having a molecular weight of more than 500.

The proportion of higher molecular weight constituents which can be separated off by means of the process according to the present invention in general varies between 99.5 and 50 percent by weight, preferably between 99 and 60 percent by weight, relative to the weight of the basic phenol polymer.

According to the process of the present invention, the organic solvent medium for the phenol polymers comprises an organic solvent. Examples of suitable organic solvents include acetone, methyl-ethyl ketone, methylisobutyl ketone, the methyl, ethyl, propyl and butyl esters of acetic acid, methoxy-propyl acetate, methyl glycol and alcohols, for example, ethanol, isopropanol and butanol, or mixtures of these compounds. The selection of the appropriate solvents depends on the structure and polarity of the respective phenol polymers. If appropriate, the solvent medium can also contain non-polar organic solvents, for example, hydrocarbons, such as n-hexane.

In the process according to the present invention, an organic solution of the phenol polymer is treated with ammonia or an amine in an amount sufficient to provide a stoichiometric deficiency of ammonia or amine, respectively. It is possible that this treatment causes an interaction between the acidic phenolic groups and the basic nitrogen, although other explanations are not excluded. Depending on the molecular size, this interaction results in a precipitation of the higher molecular weight constituents, whereas the lower molecular weight constituents remain in solution, and thus a separation takes place.

The ammonia or amine is preferably added drop-wise to the solution and the dropwise addition is continued as long as a precipitation is achieved.

The amines, which can be used in the process of the present invention apart from ammonia, are compounds which have an acid constant $p^{Ka}$ of more than about 6, measured in an aqueous solution at about 25° C. Preference is given to compounds whose $p^{Ka}$ exceeds about 9, according to the "Handbook of Chemistry and Physics," pp. D147 to D149, 58th edition, 1977, which is herein incorporated by reference.

Suitable amines include, for example, mono-, dior trialkyl amines, such as ethyl amine, propyl amine, butyl amine, dimethyl amine, diethyl amine, dipropyl amine, dibutyl amine, trimethyl amine, triethyl amine, tribuytyl amine, ethylene diamine, cyclohexyl amine or piperidine. Particular preference is given to triethyl amine, cyclohexyl amine, piperidine or ethylene diamine. It is also possible to use mixtures of the above amines.

The concentration of the initial organic solution of the phenol polymer in general ranges between about 1 and 50 percent by weight, preferably between about 5 and 40 percent by weight, relative to the weight of the solution.

The amount of ammonia or amine used in the process according to this invention preferably varies between about 1 and 40 mole percent, relative to the initially introduced phenol polymer.

In the process according to the present invention, the phenol polymer, after having been dissolved in the organic solvent, is, as a rule, directly treated, at room temperature, with the amine or ammonia which is optionally dissolved in the solvent employed for the phenol polymer. The precipitate is separated off by means of a centrifuge or filter system and mixed with an aqueous acid solution, optionally after an intermediate drying step. Subsequently, the sediment, which is now free from low-molecular weight constituents, is dried using conventional methods.

Treatment of the organic solution of the phenol polymer with ammonia or the amine is performed at room temperature for a duration of from about 0.5 to about 5 hours, but usually about one hour will be sufficient to achieve thorough separation.

The treatment of the precipitate with aqueous acid can be effected by direct treatment of the dried substance. It is, however, preferred first to take up the precipitate in an organic solvent medium and then to treat it with aqueous acid.

Examples of suitable acids are inorganic or organic acids, such as hydrochloric acid, nitric acid, sulphuric acid, acetic acid, etc., in their aqueous forms. The amount of the acidic compound added depends on the amount of ammonia or amine, which has been added before. In general, a slight excess of acid is employed, relative to the added amount of ammonia or amine. Acidic ion exchangers can also be used successfully for neutralizing the phenolic moiety.

The process according to the present invention allows for an easy, uncomplicated separation of higher molecular weight phenol polymers from low molecular weight constituents. The polymers obtained in this way are colorless and odorless powders which, when compared to the starting materials, have increased molecular weights and narrower molecular weight distribution ranges. The substantial improvements achieved by the present invention with respect to the thermal and mechanical properties of these kinds of polymers, such as glass transition temperature, film formation, tear strength, and the like, are obvious. Additionally, a liberation of monomers or other low molecular weight constituents due to heating the polymers is completely prevented by treatment in accordance with the present invention. Thus, no problems due to risks to health or pollution will occur.

The present invention furthermore relates to fractions comprising the higher molecular weight constituents of phenol polymers. These fractions have been obtained employing the process of the present invention and possess a higher osmometric molecular weight and a higher glass transition temperature than the starting phenol polymer. Special preference is given to fractions whose osmometric molecular weight is increased by a factor of about 3 and whose glass transition temperature is increased by a factor of about 1.5.

From the phenol polymers treated by the process according to the present invention, molding compounds are prepared employing known methods. Suitable fillers include inorganic mineral materials, such as limestone or glass fibers, or organic materials, such as woodflour. Due to the fact that the phenol polymers employed are virtually colorless, the molding compounds prepared in this way can be dyed with a much wider range of different colors than the materials known so far.

The increased glass transition temperature of the phenol polymers employed results in an improved heat stability of the products made from these polymers.

The invention will be described in greater detail by the following, non-limiting examples.

EXAMPLE 1

75 g of a novolak resin prepared by acid condensation of a mixture of m-, p- or o-cresol with formaldehyde are dissolved in 300 ml of ethyl acetate. 150 ml of n-hexane are added to this solution. After the insoluble constituents have been filtered off, 11 ml of triethyl amine are stirred in dropwise within 15 minutes. The colorless sediment which forms is removed by suction, washed with 200 ml of the solvent mixture and then dried in vacuo for 10 hours at room temperature.

23 g of the precipitated novolak are dissolved in 250 ml of acetone and then dropwise stirred into 2.5 l of aqueous HCl having a strength of about 5%. The precipitated polymer is suctioned off, washed neutral with distilled water and dried in vacuo for 24 hours at room temperature.

Analysis values of the untreated novolak and of the novolak treated in accordance with the present invention are as follows:

|  | untreated (Comparative example) | treated with amine/acid |
|---|---|---|
| osmometric molec. weight | 1,180 | 3,690 |
| glass transition temperature °C. | 88 | 126 |
| $M_n$*(from GPC) | 1,400 | 3,300 |
| $M_w$** (from GPC) | 13,300 | 18,050 |
| non-uniformity*** (from GPC) | 9.5 | 5.5 |

*Number average molecular weight
**Weight average molecular weight
***Defined as the quotient of $M_w$:$M_n$

EXAMPLE 2

150 g of a commercially available novolak (Alnovol PN 430) are dissolved in 700 ml of isopropanol. Gaseous ammonia is bubbled through the solution with continuous stirring at room temperature, until no further precipitation is observed. The mixture is stirred for another 10 minutes, then the precipitate is filtered off and washed with 150 ml of isopropanol.

100 ml of the precipitated novolak are dissolved in 200 ml of acetone and precipitated, with stirring, from 5 l of 1N $H_2SO_4$. The resulting novolak is washed with distilled water and then dried in vacuo for 24 hours at a temperature of 30° C.

Analysis values of the untreated novolak and of the novolak treated according to the process of the present invention are as follows:

|  | untreated (Comparative example) | treated with amine/acid |
|---|---|---|
| osmometric molec. weight | 800 | 2,400 |
| glass transition temperature (°C.) | 89 | 121 |
| $M_n$ (from GPC) | 1,400 | 4,000 |
| $M_w$ (from GPC) | 6,900 | 20,800 |
| non-uniformity | 4.9 | 5.2 |

EXAMPLE 3

50 g of a commercially available novolak (Alnovol PN 320) are dissolved in 300 ml of ethyl acetate and 200 ml of n-hexane. Thereupon, 6 ml of triethyl amine are stirred in dropwise at room temperature. When the addition is completed, stirring is continued for another 10 minutes, then the precipitate is filtered off and washed with 150 ml of the solvent composition.

30 g of the precipitated novolak are dissolved in 100 ml of acetone and precipitated, with stirring, from 3 l of 1N strength HCl. The novolak sediment remaining after washing with distilled water is dried in remaining after washing with distilled water is dried in vacuo for 24 hours at 30° C.

Analysis values of the untreated novolak and of the novolak treated by the process according to the present invention are as follows:

|  | untreated (Comparative example) | treated with amine/acid |
|---|---|---|
| osmometric molec. weight | 655 | 2,360 |
| glass transistion temperature (°C.) | 71 | 90 |
| $M_n$ (from GPC) | 1,060 | 2,800 |
| $M_w$ (from GPC) | 3,640 | 7,275 |
| non-uniformity | 3.4 | 2.6 |

EXAMPLE 4

125 g of a novolak resin prepared by acid condensation of a mixture of m- and p-cresol with formaldehyde are dissolved in 400 ml of a mixture of ethyl acetate and hexane (2:1 parts by volume). 22 ml of piperidine are then added dropwise while the solution is vigorously stirred. The precipitate is removed by suction and washed with solvent composition.

To check whether complete precipitation has been achieved, another 12 ml of piperidine are added to the filtrate. No precipitation occurs. 40 g of the isolated sediment are dissolved in 100 ml of acetone and dropwise added, with stirring, to 3 l of 1N strength $H_2SO_4$. The sediment is removed by suction, washed and dried in vacuo. A yield of 28 g is obtained.

Analysis values of the untreated novolak and of the novolak treated according to the process of the present invention are as follows:

|  | untreated (Comparative example) | treated with amine/acid |
|---|---|---|
| osmometric molec. weight | 1,070 | 3,350 |
| glass transition temperature (°C.) | 87 | 128 |
| $M_n$ (from GPC) | 1,350 | 3,800 |
| $M_w$ (from GPC) | 11,600 | 16,200 |
| non-uniformity | 8.6 | 4.3 |

APPLICATION EXAMPLE 1

Production of a molding compound from a high molecular weight novolak and hexamethylene tetramine:

35 p.b.w. (parts by weight) of a high molecular weight novolak, prepared according to the process of the present invention as described in Example 2 from a commercially available phenol resin (Alnovol PN 430), are well mixed with 5 p.b.w. of hexamethylene tetramine, 50 p.b.w. of woodflour, 15 p.b.w. of limestone, 1 p.b.w. of zinc stearate and 1 p.b.w. of magnesium oxide. Further intimate mingling of the individual constituents is achieved by a calendering treatment performed at 100° C. Then the composition, precondensed due to the calendering treatment, is finely ground and molded at a temperature of 160° C. and a pressure of 100 kg/cm². The heating time is about 1 minute per mm of layer thickness.

Utilitarian tests of the molded articles produced in this way give the following results:

| Bending strength: | 80 N/mm² |
|---|---|
| Temperature of deflection under load (Martens): | 140° C. |

The bending strength was measured according to DIN 53 452 and the temperature of deflection under load was measured according to DIN 53 458. These values demonstrate the advantages of the novel novolaks; due to their increased glass transition temperature, the temperature of deflection under load is considerably higher than the values which can conventionally be achieved with compositions of this kind, for example, values of about 70 N/mm² and about 125° C. according to a comparative example.

APPLICATION EXAMPLE 2

Preparation of a photoresist using a high molecular weight novolak possessing an increased heat stability:

7 p.b.w. of a high molecular weight novolak prepared from a cresol/formaldehyde condensate by means of the process of the present invention, and 3 p.b.w. of the esterification product obtained from 1 mole of 2,3,4-trihydroxy-benzophenone and 3 moles of naphthoquinone-(1,2)-diazide-(2)-5-sulfonic acid chloride, are dissolved in 45 p.b.w. of methyl-ethyl ketone and 45 p.b.w. of ethanol.

The solution obtained is filtered through a filter having a pore diameter of 0.2 μm and spin-coated onto a superficially oxidized silicon wafer and dried. The resulting layer thickness is about 1.7 μm.

The wafer is subjected to contact exposure through a test mask, exposure being performed for 15 seconds with an intensity of 4.5 mJ/cm², at 365 nm, and is developed with a solution comprising 5.3 p.b.w. sodium metasilicate, 3.4 p.b.w. trisodium phosphate and 91.3 p.b.w. water.

The resulting image pattern has a resolution of about 1.0 μm.

Then the structured resist layer is baked for 30 minutes at 150° C. A microscopic examination of the resist structures does not reveal any rounding-off of the edges or flowing of the resist lines.

In contrast thereto, layers which contain the customary, untreated novolak binders according to a comparative example no longer exhibit clear structures after being heated in the way described above. The comparative structures show rounded-off edges and are much broader than they were before heat treatment. In some places, there is even observed a formation of webs between the individual lines.

What is claimed is:

1. A process for treating a phenol polymer mixture that comprises lower and higher molecular weight fractions to obtain a sediment that is substantially free of phenol polymer fractions having a molecular weight of less than 500, said process comprising the steps of:
   (a) providing a first solution comprised of said phenol polymer mixture and an organic solvent in which said phenol polymer mixture is soluble;
   (b) mixing said solution with ammonia or an amine in an amount sufficient to provide a stoichiometric deficiency of said ammonia or said amine, respectively, so as to form a precipitate;
   (c) separating said precipitate from said solution;

(d) dissolving said precipitate in an organic solvent to form a second solution;

(e) adding an aqueous acid to said second solution so as to form a sediment; and (f) separating said sediment from said second solution to obtain a sediment that is substantially free of phenol polymer fractions having a molecular weight of less than 500.

2. The process according to claim 1, wherein said separating step (c) further comprises the steps of applying a suction to said precipitate and washing said precipitate with a solvent, especially the phenol polymer solvent medium.

3. The process according to claim 1, wherein said mixing step (b) comprises the dropwise addition, at room temperature, of said ammonia or said amine, respectively.

4. The process according to claim 1, wherein said separating step (f) further comprises the steps of washing said sediment with distilled water and drying said sediment.

5. The process according to claim 1, wherein said ammonia mixing comprises bubbling gaseous ammonia through said solution.

6. The process according to claim 1, wherein said organic solvent medium comprises an organic solvent or a solvent mixture.

7. The process according to claim 1, wherein said solution is mixed with from about 1 to about 40 mole percent of ammonia or amine, relative to said phenol polymer.

8. The process according to claim 1, wherein said precipitate is dissolved in an organic solvent medium prior to treatment with said aqueous acid.

9. The process according to claim 1, wherein said phenol polymer is a condensation product of, optionally substituted, phenol and formaldehyde.

10. The process according to claim 1, wherein said amine comprises a compound which in an aqueous solution of 25° C. has an acid constant $p^{Ka}$ of more than about 6.

11. The process according to claim 1, wherein said amine comprises triethylamine.

12. The process according to claim 1, wherein said amine comprises piperidine.

13. A sediment produced by the process of claim 1.

14. The sediment according to claim 13, comprising: fractions of the higher molecular weight constituents of phenol polymers which possess a higher osmometric molecular weight and a higher glass transition temperature than the starting phenol polymer of claim 1.

15. The sediment according to claim 14, wherein the osmometric molecular weight is increased by a factor of about 3 and the glass transition temperature is increased by a factor of about 1.5 as compared to said starting phenol polymer.

16. A molding compound which comprises a high molecular weight novolak obtained from said sediment produced by the process of claim 1 and at least one particulate filler material.

17. A photoresist composition, comprising a high molecular weight novolak obtained from said sediment produced by the process of claim 1 and at least one photosensitive compound.

18. The sediment according to claim 14, said polymer consisting essentially of said fractions.

19. A photoresist composition according to claim 17, consisting essentially of said high molecular weight novolak and at least one photosensitive compound.

20. The process according to claim 1, further comprising the step of drying said precipitate prior to step (d).

21. The process according to claim 1, wherein said organic solvent employed in step (a) is comprised of at least one compound selected from the group consisting of acetone, methyl-ethyl ketone, methyl-isobutyl ketone, the methyl, ethyl, propyl and butyl esters of acetic acid, methoxy-propyl acetate, methyl glycol, an alcohol and a hydrocarbon.

* * * * *